United States Patent
Jomori et al.

(10) Patent No.: US 9,219,169 B2
(45) Date of Patent: Dec. 22, 2015

(54) ANGULAR VELOCITY SENSOR

(71) Applicants: DENSO CORPORATION, Kariya, Aichi-pref. (JP); Kyoto University, Kyoto-shi, Kyoto-fu. (JP)

(72) Inventors: Tomoya Jomori, Kariya (JP); Toshiyuki Tsuchiya, Kyoto (JP)

(73) Assignees: DENSO CORPORATION, Kariya (JP); Kyoto University, Kyoto-shi (JP)

( * ) Notice: Subject to any disclaimer, the term of this patent is extended or adjusted under 35 U.S.C. 154(b) by 373 days.

(21) Appl. No.: 13/852,609

(22) Filed: Mar. 28, 2013

(65) Prior Publication Data

US 2013/0270659 A1 Oct. 17, 2013

(30) Foreign Application Priority Data

Mar. 30, 2012 (JP) .................................. 2012-80693

(51) Int. Cl.
*G01P 15/125* (2006.01)
*H01L 29/84* (2006.01)
*G01C 19/5747* (2012.01)

(52) U.S. Cl.
CPC ............ *H01L 29/84* (2013.01); *G01C 19/5747* (2013.01)

(58) Field of Classification Search
CPC ........................................................ H01L 29/84
USPC ........................................ 73/504.12, 514.12
See application file for complete search history.

(56) References Cited

U.S. PATENT DOCUMENTS

| | | | |
|---|---|---|---|
| 6,443,008 B1 | 9/2002 | Funk et al. | |
| 2003/0131664 A1 | 7/2003 | Mochida et al. | |
| 2005/0217378 A1 | 10/2005 | Ishikawa et al. | |
| 2010/0050767 A1* | 3/2010 | Higuchi et al. | 73/504.12 |
| 2010/0095769 A1 | 4/2010 | Matsumoto et al. | |
| 2010/0281980 A1 | 11/2010 | Yazawa et al. | |
| 2011/0056292 A1* | 3/2011 | Jomori et al. | 73/504.12 |

FOREIGN PATENT DOCUMENTS

| | | | |
|---|---|---|---|
| JP | 2006242730 A | | 9/2006 |
| JP | 2006-308325 A | | 11/2006 |
| WO | WO 2013094208 A1 * | | 6/2013 |

OTHER PUBLICATIONS

Office Action mailed on Jun. 30, 2015 in the corresponding JP application No. 2012-80693 (English translation attached).

* cited by examiner

*Primary Examiner* — Hezron E Williams
*Assistant Examiner* — Tarun Sinha
(74) *Attorney, Agent, or Firm* — Posz Law Group, PLC

(57) ABSTRACT

An angular velocity sensor for detecting an angular velocity includes a substrate having the stationary portion, two pair of driver weights, two detector weights, and a detector electrode. The angular velocity is detected by using a differential signal output indicating a variation in capacitances. When the absolute value of a de-coupling ratio (=(fanti−fin)/fanti) is greater than or equal to 0.07, the occurrence of the anti-phase mode movement can be prevented so as to prevent the occurrence of the output error of the gyro sensor and detect the angular velocity more precisely.

17 Claims, 5 Drawing Sheets

ANGULAR VELOCITY SENSOR

CROSS REFERENCE TO RELATED APPLICATION

This application is based on Japanese Patent Application No. 2012-80693 filed on Mar. 30, 2012, the disclosure of which is incorporated herein by reference.

TECHNICAL FIELD

The present disclosure relates to an angular velocity sensor.

BACKGROUND

Conventionally, a gyro sensor is known as a sensor for detecting an angular velocity, for example, as described in JP-A-2001-255153 corresponding to U.S. Pat. No. 6,443,008B. The gyro sensor includes a detector weight and a driver weight which oscillates parallel to a plane direction of a substrate. The driver weight and the detector weight are connected via a detector spring. Angular velocity detection is based on a detector weight oscillation in a direction perpendicular to the substrate plane by an angular velocity application with oscillation of the driver weight. The gyro sensor described in JP-A-2001-255153 includes a driver weight and a detector weight arranged on a disk form. The angular velocity is detected by oscillating the driver weight around a disk center when an angular velocity detection. Thus, the angular velocity is detected by getting a differential output derived from up and down oscillation of both sides of a disk which oscillates up and down perpendicular to a disk plane (a z-axis direction) like a seesaw by application of the angular velocity.

However, the gyro sensor in JP-A-2001-255153 may increase an output error when an impact in the z-axis direction is received. Specifically, the detector weights on both sides of the disk move in the z-axis direction when an impact in the z-axis direction is received. In cases where the detector weights on both sides move in a same mode of oscillation, an impact oscillation component in each operational output from the detector weights can be canceled by taking operational output. However, if the mode of oscillation is different from each other, the output error may increase. It is undesirable for the output error to be increase because the angular velocity cannot be detected precisely.

SUMMARY

It is an object of the present disclosure to provide a gyro sensor, which reduces an output error when an impact is applied and enable to detect an angular velocity more precisely.

According to one aspect of the present disclosure, the angular velocity sensor for detecting the angular velocity includes a substrate having a stationary portion, two pair of driver weights, two detector weights, and a detector electrode. One direction on a plane surface of the substrate is defined as an x-axis direction, another direction on the plane surface of the substrate perpendicular to the x-axis direction is defined as a y-axis direction, and a direction perpendicular to the x-axis direction and the y-axis direction is defined as a z-axis direction. The two pair of driver weights include a first pair of driver weights (i) provided to the substrate, (ii) connected to the stationary portion of the substrate through a first supporting beam, and (iii) configured to oscillate in the y-axis direction when the angular velocity sensor detects the angular velocity, and a second pair of driver weights (i) provided to the substrate, (ii) connected to the stationary portion of the substrate through a second supporting beam, and (iii) configured to oscillate in the y-axis direction when the angular velocity is detected. The two detector weights include a first detector weight connected to the first pair of driver weights through a first detector beam and a second detector weight connected to the second pair of driver weights through a second detector beam. The detector electrode is arranged at a first distance from the first detector weight and at a second distance from the second detector weight, so that a first capacitance is formed between the first detector weight and the detector electrode and a second capacitance is formed between the second detector weight and the detector electrode. The angular velocity, application of which oscillates the first detector weight and the second detector weight in opposite directions along the z-axis direction and makes a change in the first distance and a change in the second distance, is detected by using a differential signal output indicating (i) a variation in the first capacitance caused by the change in the first distance and (ii) a variation in the second capacitance caused by the change in the second distance. The absolute value of a de-coupling ratio D.R. is greater than or equal to 0.07, where $$D.R. = (fanti - fin)/fanti,$$

fin is the resonance frequency of the first detector weight and the second detector weight in the in-phase mode in which the first detector weight and the second detector weight oscillate in the same direction along the z-axis direction when an impact in the z-axis direction is applied, fanti is the resonance frequency of the first detector weight and the second detector weight in the anti-phase mode in which the first detector weight and the second detector weight oscillate in the same direction along the z-axis direction when the impact in the z-axis direction is applied.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
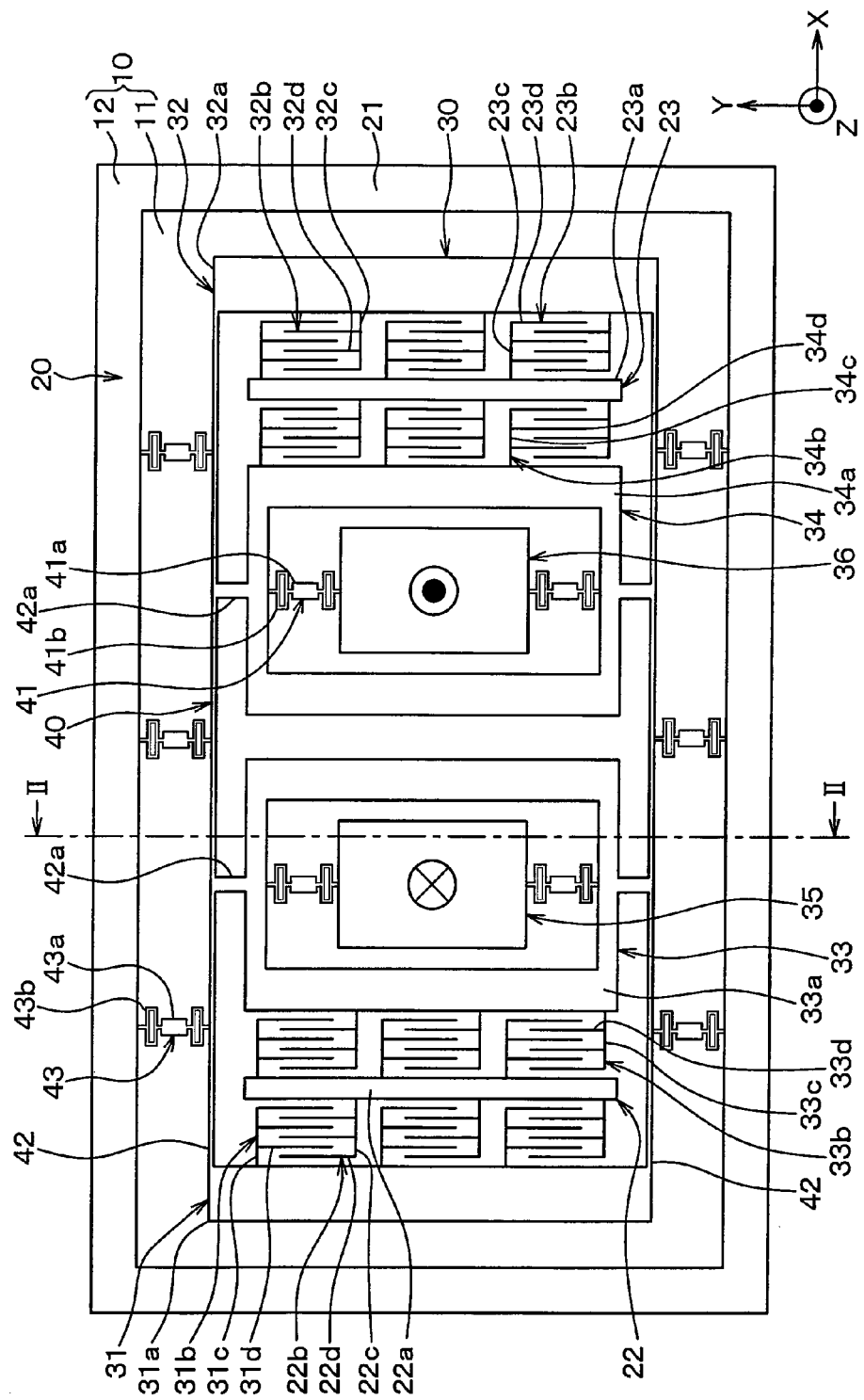
FIG. 1 is a top view illustrating a gyro sensor according to a first embodiment.

Embodiments will be described with reference to the drawings. In the below-described embodiments, like reference numerals are used to refer to like parts.

First Embodiment

As follows, the first embodiment will be described with reference to drawings. In the present embodiment, a gyro sensor in the following description is for detecting an angular velocity as a physical quantity. For example, the gyro sensor is used for detecting the angular velocity around a centerline parallel to a vertical direction of a vehicle. Application of the gyro sensor is not limited to the vehicle.

Figure 2:
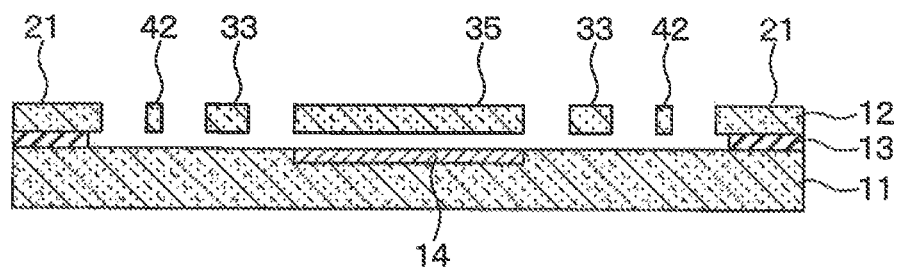
FIG. 2 is a sectional view taken along line II-II in FIG. 1.

The gyro sensor is installed on the vehicle, so that a normal direction to the sheet of FIG. 1 coincides with the vertical direction of the vehicle. As shown in FIG. 1, the gyro sensor is formed on one side of a plate-shaped substrate 10. The substrate 10, for example as shown in FIG. 2, is a silicon-on-insulator (SOI) substrate having a structure in which a buried oxide film 13 as a sacrifice layer is interposed between a support substrate 11 and a semiconductor layer 12. The sensor is constructed by etching the semiconductor layer 12 to form a pattern of a sensor structure and thereafter partially removing the buried oxide film 13 to release a portion of the sensor structure, so that the portion of the sensor structure is in a floating state.

In the following description, an x-axis direction is defined as one direction parallel to a front surface of the semiconductor layer 12. As shown in FIG. 1, the x direction is the lower-to-upper direction of the sheet of FIG. 1. A y-axis direction is defined as a direction perpendicular to the x-axis direction on the surface of the semiconductor layer 12. As shown in FIG. 1, the y direction is the right-to-left direction of the sheet of FIG. 1. A z-axis direction is defined as a direction perpendicular to the x-axis direction and the y-axis direction. As shown in FIG. 1, the z direction is the front-to-back direction of the sheet of FIG. 1.

The semiconductor layer 12 is patterned to form a stationary portion 20, a movable portion 30 and a beam portion 40. The buried oxide film 13 is left on at least part of a back surface of the stationary portion 20. The stationary portion 20 is fixed to the supporting substrate 11 through the buried oxide film 13 so as not to release from the supporting substrate 11. The movable portion 30 and the beam portion 40 compose an oscillator of the gyro sensor. The buried oxide film 13 on a back surface side of the movable portion 30 is eliminated so that the movable portion 30 is released and floating from the supporting substrate 11. The beam portion 40 supports the movable portion 30. The beam portion 40 enables the movable portion 30 to displace in the y-axis and z-axis direction to detect an angular velocity. As follows, the structure of the stationary portion 20, the movable portion 30 and the beam portion 40 will be described specifically.

The stationary portion 20 includes (i) a supporting stationary portion 21 for supporting the movable portion 30 and (ii) driver stationary portions 22, 23 to which a driving voltage is applied.

The supporting stationary portion 21 is arranged so as to surround a peripheral of the sensor structure such as the other part of the stationary portion 20 (the driver stationary portions 22, 23) and the movable portion 30. The supporting stationary portion 21 supports the movable portion 30 through the beam portion 40 at the inside wall of the supporting stationary portion 21. In one example of the present embodiment, the supporting stationary portion 21 surrounds all around the sensor structure. In another example of the present embodiment, the supporting stationary portion 21 may surround a part of the sensor structure.

As described below, the driver stationary electrodes 22b includes (i) comb-teeth shape electrodes each opposed to a set of comb teeth of a comb-shaped driver movable electrode 31b of the outer driver weight 31 and (ii) comb-teeth shape electrodes each opposed to a set of comb teeth of a comb-shaped driver movable electrode 33b of the inner driver weight 33. The driver stationary electrode 23b includes (i) comb-teeth shape electrodes each opposed to a set of comb teeth of a comb-shaped driver movable electrode 32b of the outer driver weight 32 and (ii) comb-teeth shape electrodes each opposed to a set of comb teeth of a comb-shaped driver movable electrode 34b of the inner driver weight 34. Specifically, each driver stationary electrode 22b, 23b has a structure in which each supporting portion 22c, 23c extends in the x-axis direction and each comb-teeth shaped electrode 22d, 23d extends in the y-axis direction from the supporting portions 22c, 23c. Multiple driver stationary electrodes 22b, 23b, each having the above-described structure, are arranged on both sides (upper side and lower side) of the base portions 22a, 23a so as to line up in the y-axis direction.

The base portions 22a, 23a extend in the y-axis direction. The multiple driver stationary electrodes 22b, 23b are connected to each base portion 22a, 23a. External AC voltage (drive voltage) is applied to the base portions 22a, 23a through bonding wires connecting with bonding pads (not shown) provided on the base portions 22a, 23a. An arbitrary AC voltage can be applied to each driver stationary electrode 22b, 23b by applying an arbitrary AC voltage to the base portions 22a, 23b.

As described below, the driver stationary electrodes 22b includes (i) comb-teeth shape electrodes each opposed to a comb teeth of a comb-shaped driver movable electrode 31b of the outer driver weight 31 and (ii) comb-teeth shape electrodes each opposed to a comb teeth of a comb-shaped driver movable electrode 33b of the inner driver weight 33. The driver stationary electrode 23b includes (i) comb-teeth shape electrodes each opposed to a comb teeth of a comb-shaped driver movable electrode 32b of the outer driver weight 32 and (ii) comb-teeth shape electrodes each opposed to a comb teeth of a comb-shaped driver movable electrode 34b of the inner driver weight 34. Specifically, each driver stationary electrode 22b, 23b has a structure in which each supporting portion 22c, 23c extends in the x-axis direction and each comb-teeth shaped electrode 22d, 23d extends in the y-axis direction from the supporting portions 22c, 23c. Multiple driver stationary electrodes 22b, 23b, each having the above-described structure, are arranged on both sides (upper side and lower side) of the base portions 22a, 23a so as to line up in the y-axis direction.

The movable portion 30 is composed of the outer driver weights 31, 32, the inner driver weights 33, 34 and detector weights 35, 36. The movable portion 30 is oscillated when angular velocity detection and movable in response to the angular velocity application. The outer driver weight 31, the inner driver weight 33 including the detector weight 35, the inner driver weight 34 including the detector weight 36, and the outer driver weight 32 are arranged in the x-axis direction in this order.

The outer driver weights 31, 32 include mass portions 31a, 32a and the driver movable electrodes 31b, 32b, respectively.

The mass portions 31a, 32a extend in the y-axis direction. The mass portion 31a is opposed to the base portion 22a of the driver stationary portion 22. The mass portion 32a is opposed to the base portion 23a of the driver stationary portion 23. The outer driver weights 31, 32 are movable in the y-axis direction by using the mass portions 31a, 32a as weights.

The driver movable electrode 31b includes comb-teeth shape electrodes each opposed to a set of comb teeth of a comb-shaped driver stationary electrodes 22b of the driver stationary portion 22. The driver movable electrode 32b includes comb-teeth shape electrodes each opposed to a set of comb teeth of a comb-shaped driver stationary electrode 23b of the driver movable electrodes 23. Specifically, each driver movable electrode 31b, 32b has a structure in which each supporting portion 31c, 32c extends in the x-axis direction and each comb-teeth shaped electrode 31d, 32d extends in the y-axis direction from the supporting portions 31c, 32c. Multiple driver movable electrodes 31b, 32b, each having the above-described structure, are arranged on the side of the driver stationary portions 22, 23 of the mass portions 31a, 32a so as to line up in the y-axis direction.

The inner driver weights 33, 34 include mass portions 33a, 34a and the driver movable electrodes 33b, 34b.

The mass portions 33a, 34a are rectangular frames. The inner driver weights 33, 34 are movable to the y-axis direction by using the mass portions 33a, 34b as weights. Each of two opposite sides of the mass portions 33a, 34a is parallel with the x-axis direction or the y-axis direction, respectively. Each one of two sides parallel with the y-axis direction of the mass portions 33a, 34a is opposed to the base portions 22a, 23a of the driver stationary portions 22, 23. Specifically, one of two sides parallel with the y-axis direction of the mass portions 33a, 34a is opposed to the base portions 22a, 23a of the driver stationary portions 22, 23. The driver movable electrodes 33b, 34b of the mass portions 33a, 34a is included in the side of the base portions 22a, 23a.

The driver movable electrode 33b includes comb-teeth shape electrodes each opposed to a set of comb teeth of a comb-shaped driver stationary electrode 22b of the driver stationary portion 22. The driver movable electrode 34b includes comb-teeth shape electrodes each opposed to a set of comb teeth of a comb-shaped driver stationary electrode 23b of the driver stationary portion 23. Specifically, each driver movable electrode 33b, 34b has a structure in which a supporting portion 33c, 34c extends in the x-axis direction and a comb-teeth shaped electrode 33d, 34d extends in the y-axis direction from the supporting portions 33c, 34c. Multiple driver movable electrodes 33b 34b, each having the above-described structure, are arranged on the side which is opposed to the base portions 22a, 23a of the mass portions 33a, 34a so as to line up in the y-axis direction.

The detector weights 35, 36 are rectangular shape and oscillated in the z-axis direction when the angular velocity is applied. A detector electrode 14 is formed on a semiconductor layer 12 side surface of the supporting substrate 11. The position of the detector electrode 14 corresponds to the position of the detector weights 35, 36. The angular velocity is detected by the variation of distance between the detector weights 35, 36 and the detector electrode 14 in the application of the angular velocity.

The beam portion 40 includes a detector beam 41, a driver beam 42, and a supporting beam 43.

The detector beam 41 is a beam including a detector spring which connects a certain surface, which is parallel to the x-axis direction, of the inside wall of the mass portions 33a, 34a of the inner driver weights 33, 34 and a certain surface, which is parallel to the x-axis direction, of the outside wall of the detector weights 35, 36. The detector beam 41 is movable in the x-axis direction. The detector weighs 35, 36 are movable in the z-axis direction relative to the inner driver weights 33, 34 based on the displacement of the detector beam 41.

The driver beam 42 connects the outer driver weights 31, 32 with the inner driver weights 33, 34. Because of the driver beam 42, the outer driver weights 31, 32 and the inner driver weights 33, 34 can move in the y-axis direction. The outer driver weights 31, the inner driver weight 33, the inner driver weight 34 and the outer driver weight 31 are connected by the driver beam 42 while being arranged in order.

In the present embodiment, the driver beam 42 can correspond to an example of a joining beam.

Specifically, the driver beam 42 is composed of linear beam including a first linear beam and a second linear beam each extending in the x-axis direction (the lower-to-upper direction of the sheet of FIG. 1). The outer driver weights 31, 32 and the inner driver weights 33, 34 are disposed between the first linear bean and the second linear beam and are connected to each of the first linear beam and the second linear beam. Although the driver beam 42 may be directly connected with the outer driver weights 31, 32 and the inner driver weights 33, 34, the driver beam 42 is connected with the inner driver weights 33, 34 through the linker portion 42a as an example in the present embodiment.

The supporting beam 43 is a beam including a joint spring supporting the outer driver weights 31, 32, the inner driver weights 33, 34 and the detector weights 35, 36. Specifically, the supporting beam 43 is located between an inner wall of the supporting stationary portion 21 and the driver beam 42. The supporting beam 43 supports each weight 31 to 36 through the driver beam 42 at the supporting stationary portion 21 and enable the weights 31 to 36 to move in the z-axis direction etc.

In the present embodiment, the detector weights 35, 36 and the outer driver weights 31, 32 and the inner driver weights 33, 34 are movable to the z-axis direction due to the detector beam 41 and the supporting beam 43 of the beam portion 40. As described particularly below, the detector beam 41 and the supporting beam 43, especially based on the structure of the supporting beam 43, can detect an angular velocity more precisely, by reducing an output error against impact.

Specifically, the detector beam 41 and the supporting beam 43 in the present embodiment are composed of a combination of middle rigid bodies 41a, 43a and torsion bars 41b, 43b. The torsion bars 41b, 43b act as torsion portions. The torsion bars 41b, 43b are arranged at both ends of the middle rigid bodies 41a, 43a. The detector beam 41 connects the torsion bar 41b with the detector weights 35, 36 and the inner driver weights 33, 34. The supporting beam 43 connects the torsion bar 43b with the supporting stationary portion 21 and the driver beam 42.

Figure 3:
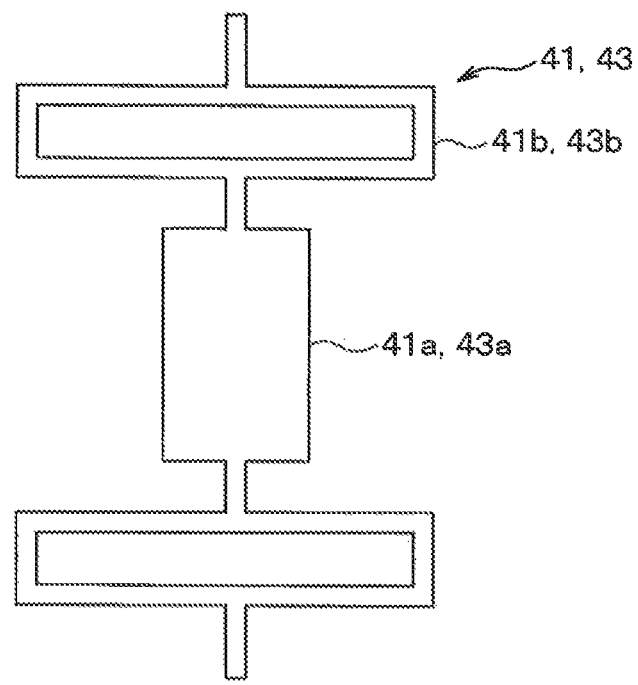
FIG. 3 is an enlarged top view illustrating a detection beam and a support beam.

For example, as described in FIG. 3, the detector beam 41 and the supporting beam 43 include the middle rigid bodies 41a, 43a and the torsion bars 41b, 43b. The middle rigid bodies 41a, 43a include of linear parts. The torsion bars 41b, 43b include a rectangular frame shape part connected at both ends of two linear beams. The displacement in the z-axis direction is permitted by twisting of the torsion bars 41b, 43b. The detector beam 41 and the supporting beam 43 are easily twisted because of the rectangular frame shape of the torsion bars 41b, 43b so that the displacement in the z-axis direction can be increased.

The gyro sensor, as described above, includes a pair of an angular velocity detection structure. A first detection structure includes the outer driver weights 31 the inner driver weights 33 and the detector weights 35. A second detection structure includes the outer driver weight 32, the inner driver weight 34 and the detector weight 36. The gyro sensor can detect an angular velocity more precisely, by reducing an output error against an impact, due to the structure of the detector beam 41 and the supporting beam 43, especially based on the structure of the supporting beam 43.

Figure 4:
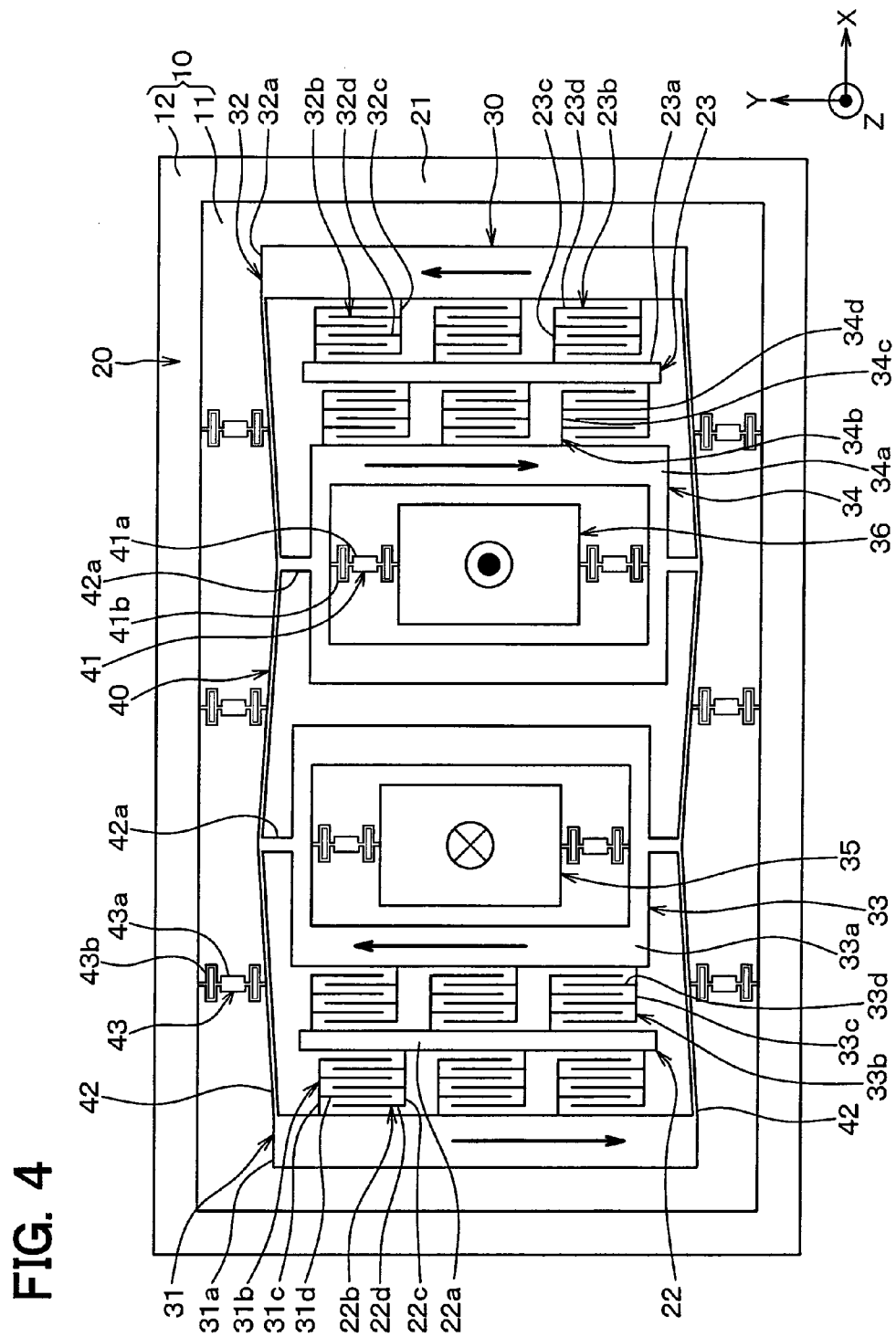
FIG. 4 is a schematic view illustrating elementary action of a gyro sensor.

Next, we will explain an operation of the gyro sensor with reference to FIG. 4. A mark indicated with a filled circle in a circle means oscillation in a far side direction of a vertical plane of the sheet and a mark indicated with x mark in a circle means oscillation in a near side direction of a vertical plane of the sheet.

As described in FIG. 4, the gyro sensor oscillates the outer driver weights 31, 32 and the inner driver weights 33, 34 along the y-axis direction as an elementary action when detecting the angular velocity. Specifically, by applying an AC voltage to the driver stationary portions 22, 23, a potential difference is generated between the outer driver weights 31, 32 and the inner driver weights 33, 34 so that an electrostatic force in the y-axis direction is produced by the potential difference. Each driver weight 31 to 34 is oscillated along the y-axis direction by the electrostatic force. Monitoring the oscillation of each driver weight 31 to 34 along the y-axis direction with changing a frequency of the AC voltage, a frequency of the AC voltage is modulated so as to obtain an intended driver resonance frequency.

As described by arrows in FIG. 4, the outer driver weight 31 and the inner driver weight 33 are oscillated oppositely in the y-axis direction. The movement is realized by an arrangement of the driver stationary electrode 22b of the driver stationary portion 22, the driver movable electrode 31b of the outer driver weight 31 and the driver movable electrode 33b of the inner driver weight 33. As described by arrows in FIG. 4, the outer driver weight 32 and the inner driver weight 34 are oscillated oppositely in the y-axis direction. The movement is realized by an arrangement of the driver stationary electrode 23b of the driver stationary portion 23, the driver movable electrode 32b of the outer driver weight 32 and the driver movable electrode 34b of the inner driver weight 34. Furthermore, the inner driver weights 33, 34 are oscillated oppositely each other in the y-axis direction. As described above, the gyro sensor executes the elementary action by oscillating the movable portion 30 when detecting the angular velocity.

In the elementary action, each driver weight 31 to 34 is movable along the y-axis direction by S-shaped flapping of the driver beam 42. A joining portion of the driver beam 42 connecting with the supporting beam 43 is hardly movable because of an amplitude node (fixed point) of the flapping.

When the angular velocity around the z-axis is applied to the gyro sensor while the angular velocity sensor is performing the elementary action as described above in FIG. 4, the detector weights 35, 36 move oppositely each other in the z-axis direction by a Coriolis force. This movement causes a displacement of a distance between the detector weights 35, 36 and the detector electrode 14. The capacitance value of the capacitor formed between the detector weights 35, 36 and the detector electrode 14 is changed. The capacitance of the capacitor may be changed according to a changed in angular velocity, because the distance between the detector weights 35, 36 and the detector electrode 14 is changed according to the magnitude of the angular velocity.

Thus, two signals are received from each detector electrode 14 which is located opposed to the detector weights 35, 36 through wiring patterns (not shown). The angular velocity is detected by reading a variation of each capacitance value of the capacitors based on the signals. In the present embodiment, it is able to detect the angular velocity more precisely because a differential output can be obtained by using signals from each sets of the angular velocity detector structure.

The detector weights 35, 36 have two modes of a resonance frequency along the z-axis direction. One mode of the resonance frequency is referred to as a resonance frequency fin. Another mode of the resonance frequency is referred to as a resonance frequency fanti. The resonance frequency fin is an in-phase mode in which the detector weights 35, 36 oscillate to a same direction in the z-axis direction. The resonance frequency fanti is an anti-phase mode in which the detector weights 35, 36 oscillates to an opposite direction in the z-axis direction. This will be described with reference to FIG. 5.

Figure 5:
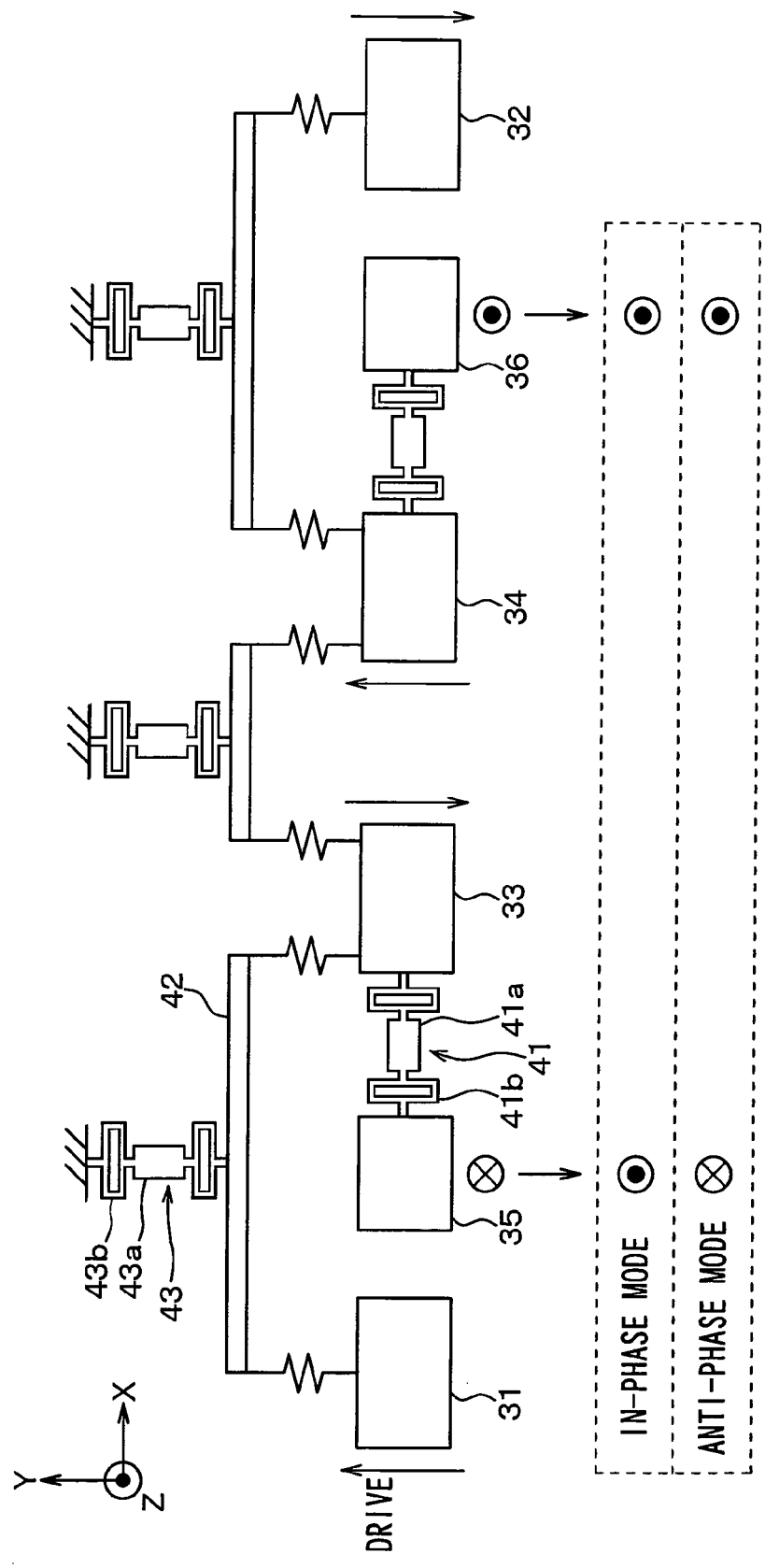
FIG. 5 is a schematic view illustrating a gyro sensor in FIG. 1.

The schematic diagram of the gyro sensor in the present embodiment is described in FIG. 5. The supporting stationary portion 21 supports the driver beam 42 through the supporting beam 43 including the joint spring in the z-axis direction. The driver beam 42 supports a pair of the outer driver weight 31 and the inner driver weight 33, and a pair of the outer driver weight 32 and the inner driver weight 34. The inner driver weights 33, 34 include the detector weights 35, 36 through the detector beam 41 including the detector spring in the z-axis direction. As described by arrows in FIG. 5, the outer driver weight 31 and the inner driver weight 33 oscillate oppositely in the y-axis direction when detecting the angular velocity. The detector weights 35, 36 oscillate oppositely each other in the z-axis direction when the angular velocity is applied. The magnitude of an oscillation of the detector weights 35, 36 changes according to the applied angular velocity. The angular velocity can be detected as the variation of the capacitance value of the capacitor formed between the detector weights 35, 36 and the detector electrode 14.

As described in FIG. 5, the in-phase mode means a case in which the detector weights 35, 36 oscillate in the same direction in the z-axis direction when an impact is applied. The anti-phase mode means a case in which the detector weights 35, 36 oscillate in opposite directions in the z-axis direction when an impact is applied. In cases where the detector weights 35, 36 oscillate in the in-phase mode when an impact in the z-axis direction is applied, each signal derived from two pairs of the angular velocity detector structure is in a differential amplification. The signal derived from the oscillation caused by the impact is canceled. However, in cases where the detector weights 35, 36 oscillate in the anti-phase mode, each signal derived from the oscillation caused by the impact is not canceled by a differential amplification. Thus, the signal produces an output error.

Figure 6:
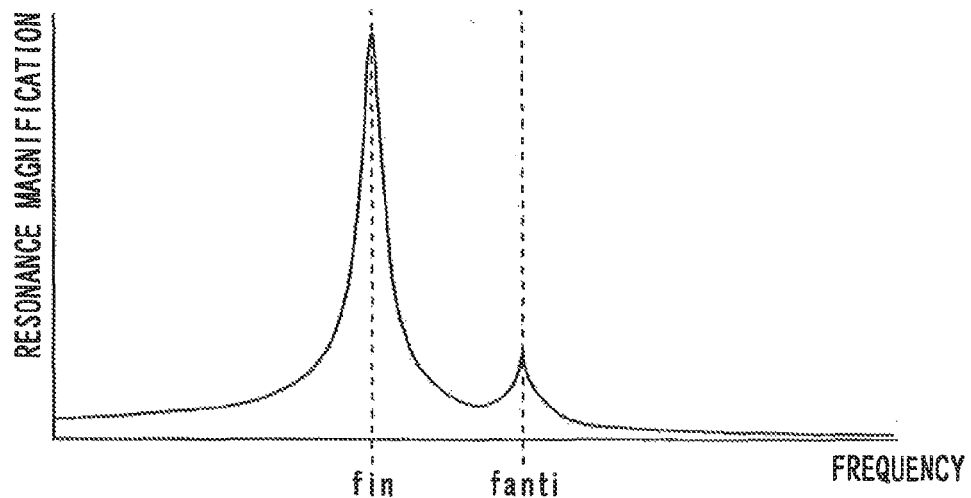
FIG. 6 is a diagram illustrating a frequency characteristic (response curve) of a resonance magnification of a comparison example.

In cases where the impact in the z-axis direction is received, a resonance magnification (a magnitude of response) changes with frequency component of the impact. Specifically, a frequency characteristic (response curve) of a resonance magnification is expressed as described in FIG. 6. The resonance magnification is maximized at the resonance frequency fin. The resonance magnification sharply decreases around the resonance frequency fin. The more the resonance frequency is separated from the resonance frequency fin, the lower the resonance magnification. However, there is a resonance frequency fanti apart from the resonance frequency fin. The resonance magnification increases to some extent at the resonance frequency fanti, although the response magnification at the resonance frequency fanti is much less than the response magnification at the resonance frequency fin. The component of the resonance frequency fanti included in the impact causes two detector weights 35, 36 to oscillate in the opposite direction each other. Thus, the output error as described above is produced.

As a result of our research, it is disclosed that the resonance magnification at the resonance frequency fanti increases as the resonance frequency fanti is close to the resonance frequency fin. Thus, as described in FIG. 6, the resonance magnification decreases sharply around the resonance frequency fin with the in-phase mode. However, in cases where the resonance frequency fanti is too close to the resonance frequency fin, the component of the resonance frequency fanti included in the impact is located in a region where the component of the resonance frequency fanti included in the impact is not enough to be decreased. The component of the resonance frequency fanti included in the impact causes a movement with the anti-phase mode in the oscillation.

Figure 7:
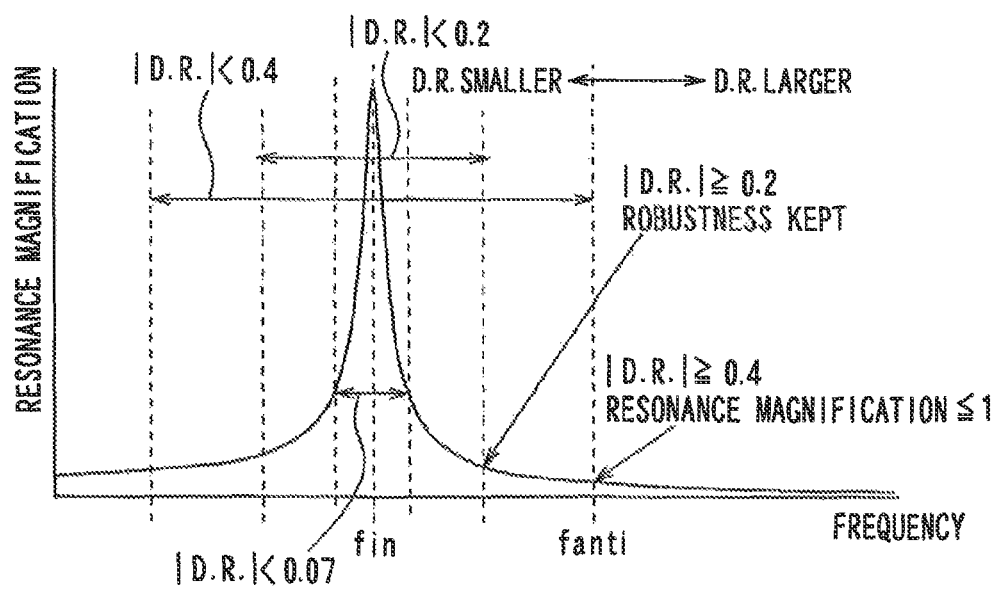
FIG. 7 is a diagram illustrating a frequency characteristic (response curve) of the present embodiment.

Therefore, an induction of the movement with the anti-phase mode can be prevented by separating the resonance frequency fin from the resonance frequency fanti so that the component of the resonance frequency fanti included in the impact is enough to be decreased. The frequency characteristic of the resonance magnification can be adjusted by adjusting a spring movable in the z-axis direction, in the present embodiment, the supporting beam 43, the detector beam 41, especially based on the adjustment of the supporting beam 43. We analyzed the frequency characteristic of the resonance magnification by adjusting a load rate of the spring movable in the z-axis direction. As a result, as shown in FIG. 7, in cases where the resonance frequency fanti is apart from the resonance frequency fin, the resonance magnification at the resonance frequency fanti decreases.

Specifically, a De-coupling ratio (D.R.) is defined from the resonance frequency fanti and the resonance frequency fin. A difference which is the resonance frequency fanti minus the resonance frequency fin is calculated, and the difference is divided by the resonance frequency fanti. The value is defined as decoupling ratio (D.R.) (=(fanti−fin)/fanti). In a case where the absolute value of D.R. is greater than or equal to 0.07, the resonance frequency fanti is apart from the resonance frequency fin and the resonance magnification at the resonance frequency fanti decreases. In a case where the absolute value of D.R. is greater than or equal to 0.2, the resonance magnification is less than or equal to 3 with about ten percent errors regardless of a peak value and a robustness is kept as described in FIG. 7. A peak value (Q value) is defined as the resonance magnification of the resonance frequency fin. Preferably, in cases where the absolute value of D.R. is greater than or equal to 0.4, the resonance magnification of the resonance frequency fanti can be less than or equal to 1 so that the component of the resonance frequency fanti included in the impact decreases enough and the induction of the movement with anti-phase mode can be prevented. For example, when the resonance frequency fin is 10 kHz and the resonance frequency fanti is 16 kHz, the absolute value of D.R. is greater than or equal to 0.4 and the resonance magnification can be less than or equal to 1.

As describe above, D.R. is defined as the value which is the difference divided by the resonance frequency. The difference is the resonance frequency minus the resonance frequency fin. By adjusting the absolute value of D.R. is greater than or equal to 0.2, preferably greater than or equal to 0.4, the occurrence of the anti-phase mode movement can be prevented so as to prevent the occurrence of the output error of the gyro sensor and to detect the angular velocity more precisely.

Obtaining D.R. as described above, it is necessary to adjust the joint spring and the detector spring movable in the z-axis direction. In the present embodiment, it is necessary to adjust the setting of the supporting beam 43 and the detector beam 41, especially the supporting beam 43. The supporting beam 43 and the detector beam 41 include the composition of the middle rigid bodies 41a, 43a and the torsion bars 41b, 43b. The supporting beam 43 and the detector beam 41 become more flexible spring by decreasing the load rate of the torsion of the torsion bars 41b, 43b so that detection sensitivity can be improved because the detector electrode 14 enable to move in the z-axis direction more easily. D.R. as described above is adjusted more easily.

Other Embodiment

In the above embodiment, a silicon-on-insulator substrate is employed as the substrate 10. The silicon-on-insulator is one example of the substrate 10 and may be a material other than a silicon-on-insulator substrate. Because the silicon-on-insulator is employed as the substrate 10, the supporting substrate 11 includes the detector electrode 14. The detector electrode 14 may be arranged in the front side of the detector weights 35, 36, because it is only necessary for the detector electrode 14 to be arranged in a position at a specific distance from the detector weights 35, 36 in the z-axis direction.

Although one example of the structure of the gyro sensor is described, a design may be changed appropriately. The structure including all of weights 31 to 36 which are connected by the linear driver beam 42 and oscillated by deflection of the driver beam 42 is described in the present embodiment. However, the driver beam 42 may be split into multiple parts as described in FIG. 5.

It is not limited to the angular velocity detection structure in which a pair of two each of the outer driver weights 31, 32, the inner driver weights 33, 34 and the detector weights 35, 36 is included. The present embodiment is applicable to the other gyro sensor including several pairs of the angular velocity detection structure.

Summarizing the above embodiments, the angular velocity sensor for detecting the angular velocity includes the substrate having the stationary portion, two pair of driver weights, two detector weights, and a detector electrode. One direction on the plane surface of the substrate is defined as the x-axis direction, another direction on the plane surface of the substrate perpendicular to the x-axis direction is defined as the y-axis direction, and a direction perpendicular to the x-axis direction and the y-axis direction is defined as the z-axis direction. The two pair of driver weights include a first pair of driver weights (i) provided to the substrate, (ii) connected to the stationary portion of the substrate through a first supporting beam, and (iii) configured to oscillate in the y-axis direction when the angular velocity sensor detects the angular velocity, and a second pair of driver weights (i) provided to the substrate, (ii) connected to the stationary portion of the substrate through a second supporting beam, and (iii) configured to oscillate in the y-axis direction when the angular velocity is detected. The two detector weights include a first detector weight connected to the first pair of driver weights through a first detector beam and a second detector weight connected to the second pair of driver weights through a second detector beam. The detector electrode is arranged at a first distance from the first detector weight and at a second distance from the second detector weight, so that a first capacitance is formed between the first detector weight and the detector electrode and a second capacitance is formed between the second detector weight and the detector electrode. The angular velocity, application of which oscillates the first detector weight and the second detector weight in opposite directions along the z-axis direction and makes a change in the first distance and a change in the second distance, is detected by using a differential signal output indicating (i) a variation in the first capacitance caused by the change in the first distance and (ii) a variation in the second capacitance caused by the change in the second distance. The absolute value of a de-coupling ratio D.R. is greater than or equal to 0.07, where $$D.R.=(fanti-fin)/fanti,$$

fin is the resonance frequency of the first detector weight and the second detector weight in the in-phase mode in which the first detector weight and the second detector weight oscillate in the same direction along the z-axis direction when an impact in the z-axis direction is applied, fanti is the resonance frequency of the first detector weight and the second detector weight in the anti-phase mode in which the first detector weight and the second detector weight oscillate in the same direction along the z-axis direction when the impact in the z-axis direction is applied.

As describe above, de-coupling ratio is defined as the value which is the difference divided by the resonance frequency. The difference is the resonance frequency minus the resonance frequency fin. By adjusting the absolute value of D.R. is greater than or equal to 0.2, preferably greater than or equal to 0.4, the occurrence of the anti-phase mode movement can be prevented so as to prevent the occurrence of the output error of the gyro sensor and to detect the angular velocity more precisely.

For example, it is preferable that the detector beam 41 and the supporting beam 43 include the composition of the middle rigid bodies 41a, 43a and the torsion bars 41b, 43b and that the detector weight is movable in the z-axis direction by the torsion of the torsion bars.

As described above, by including the middle rigid bodies and the torsion bar, the supporting beam 43 and the detector beam 41 become more flexible spring with decreasing of the load rate of the torsion of the torsion bars 41b, 43b. Detection sensitivity can be improved because the detector electrode 14 can move in the z-axis direction more easily. The de-coupling ratio is also adjusted more easily.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An angular velocity sensor for detecting an angular velocity, comprising:
    a substrate having a stationary portion, wherein one direction on a plane surface of the substrate is defined as an x-axis direction, another direction on the plane surface of the substrate perpendicular to the x-axis direction is defined as a y-axis direction, and another direction perpendicular to the x-axis direction and the y-axis direction is defined as a z-axis direction;
    two pair of driver weights including
        a first pair of driver weights (i) provided to the substrate, (ii) connected to the stationary portion of the substrate through a first supporting beam, and (iii) configured to oscillate in the y-axis direction when the angular velocity sensor detects the angular velocity, and
        a second pair of driver weights (i) provided to the substrate, (ii) connected to the stationary portion of the substrate through a second supporting beam, and (iii) configured to oscillate in the y-axis direction when the angular velocity is detected;
    two detector weights including:
        a first detector weight connected to the first pair of driver weights through a first detector beam and
        a second detector weight connected to the second pair of driver weights through a second detector beam;
    a first detector electrode arranged at a first distance from the first detector weight; and
    a second detector electrode arranged at a second distance from the second detector weight,
    wherein:
    a first capacitance is formed between the first detector weight and the first detector electrode and a second capacitance is formed between the second detector weight and the second detector electrode;
    the annular velocity, application of which oscillates the first detector weight and the second detector weight in opposite directions along the z-axis direction and makes a first change in the first distance and a second change in the second distance, is detected by using a differential signal output indicating (i) a variation in the first capacitance caused by the first change in the first distance and (ii) a variation in the second capacitance caused by the second change in the second distance; and
    the first and second supporting beams and the first and second detector beams are arranged so that
    an absolute value of a de-coupling ratio D.R. is greater than or equal to 0.07, where D.R.=(fanti−fin)/fanti, fin is a resonance frequency of the first detector weight and the second detector weight in an in-phase mode in which the first detector weight and the second detector weight oscillate in a same direction along the z-axis direction when an impact in the z-axis direction is applied,
    fanti is a resonance frequency of the first detector weight and the second detector weight in an anti-phase mode in which the first detector weight and the second detector weight oscillate in the opposite directions along the z-axis direction when the impact in the z-axis direction is applied,
    wherein:
    the substrate includes a joining beam;
    the first pair of driver weights includes
        a first inner driver weight surrounding the first detector weight and connecting with the first detector weight through the first detector beam, and
        a first outer driver weight connecting with the first inner driver weight through the joining beam;
    the second pair of driver weights includes
        a second inner driver weight surrounding the second detector weight and connecting with the second detector weight through the second detector beam, and
        a second outer driver weight connecting with the second inner driver weight through the joining beam;
    each of the first inner driver weight and the second inner driver weight is arranged between the first outer driver weight and the second outer driver weight; and
    when the angular velocity sensor detects the angular velocity,
    the first inner driver weight and the first outer driver weight of the first pair of driver weights oscillate in the opposite directions along the y direction and
    the second inner driver weight and the second outer driver weights the second pair of driver weights oscillate in the opposite directions along the y direction.

2. The angular velocity sensor according to claim 1, wherein
    the absolute value of the de-coupling ratio is greater than or equal to 0.2.

3. The angular velocity sensor according to claim 1, wherein
    the absolute value of the de-coupling ratio is greater than or equal to 0.4.

4. An angular velocity sensor for detecting an angular velocity, comprising:
    a substrate having a stationary portion, wherein one direction on a plane surface of the substrate is defined as an x-axis direction, another direction on the lane surface of the substrate perpendicular to the x-axis direction is defined as a y-axis direction, and another direction perpendicular to the x-axis direction and the y-axis direction is defined as a z-axis direction;

two pair of driver weights including
  a first pair of driver weights (i) provided to the substrate, (ii) connected to the stationary portion of the substrate through a first supporting beam, and (iii) configured to oscillate in the y-axis direction when the angular velocity sensor detects the angular velocity, and
  a second pair of driver weights (i) provided to the substrate, (ii) connected to the stationary portion of the substrate through a second supporting beam, and (iii) configured to oscillate in the y-axis direction when the angular velocity is detected:

two detector weights including:
  a first detector weight connected to the first pair of driver weights through a first detector beam and
  a second detector weight connected to the second pair of driver weights through a second detector beam;

a first detector electrode arranged at a first distance from the first detector weight; and a second detector electrode arranged at a second distance from the second detector weight, wherein:
a first capacitance is formed between the first detector weight and the first detector electrode and a second capacitance is formed between the second detector weight and the second detector electrode;

the angular velocity, application of which oscillates the first detector weight and the second detector weight in opposite directions along the z-axis direction and makes a first change in the first distance and a second change in the second distance, is detected by using a differential signal output indicating (i) a variation in the first capacitance caused by the first change in the first distance and (ii) a variation in the second capacitance caused by the second change in the second distance; and the first and second supporting beams and the first and second detector beams are arranged so that an absolute value of a de-coupling ratio D.R. is greater than or equal to 0.07, where $$D.R.=(fanti-fin)/fanti,$$

fin is a resonance frequency of the first detector weight and the second detector weight in an in-phase mode in which the first detector weight and the second detector weight oscillate in a same direction along the z-axis direction when an impact in the z-axis direction is applied, fanti is a resonance frequency of the first detector weight and the second detector weight in an anti-phase mode in which the first detector weight and the second detector weight oscillate in the opposite directions along the z-axis direction when the impact in the z-axis direction is applied, wherein
each of the first supporting beam and the second supporting beam includes a first middle rigid body and two first torsion bars located in both ends of the first middle rigid body, and each of the first supporting beam and the second supporting beam is movable in the z-axis direction by torsion of the two first torsion bars.

5. The angular velocity sensor according to claim 4, wherein
each of the two first torsion bars of the first supporting beam and the second supporting beam includes a first rectangular frame shape part, the first rectangular frame shape part includes first and second linear beams, one end and the other end of the first linear beam are coupled with one end and the other end of the second linear beam, respectively.

6. The angular velocity sensor according to claim 4, wherein
the absolute value of the de-coupling ratio is greater than or equal to 0.2.

7. The angular velocity sensor according to claim 4, wherein
the absolute value of the de-coupling ratio is greater than or equal to 0.4.

8. An angular velocity sensor for detecting an angular velocity comprising:
a substrate having a stationary portion, wherein one direction on a plane surface of the substrate is defined as an x-axis direction, another direction on the plane surface of the substrate perpendicular to the x-axis direction is defined as a y-axis direction, and another direction perpendicular to the x-axis direction and the y-axis direction is defined as a z-axis direction;

two pair of driver weights including
  a first pair of driver weights (i) provided to the substrate, (ii) connected to the stationary portion of the substrate through a first supporting beam, and (iii) configured to oscillate in the y-axis direction when the angular velocity sensor detects the angular velocity, and
  a second pair of driver weights (i) provided to the substrate, (ii) connected to the stationary portion of the substrate through a second supporting beam, and (iii) configured to oscillate in the y-axis direction when the angular velocity is detected;

two detector weights including:
  a first detector weight connected to the first pair of driver weights through a first detector beam and
  a second detector weight connected to the second pair of driver weights through a second detector beam;

a first detector electrode arranged at a first distance from the first detector weight; and a second detector electrode arranged at a second distance from the second detector weight, wherein:
a first capacitance is formed between the first detector weight and the first detector electrode and a second capacitance is formed between the second detector weight and the second detector electrode;

the angular velocity, application of which oscillates the first detector weight and the second detector weight in opposite directions along the z-axis direction and makes a first change in the first distance and a second change in the second distance, is detected by using a differential signal output indicating (i) a variation in the first capacitance caused by the first change in the first distance and (ii) a variation in the second capacitance caused by the second change in the second distance; and the first and second supporting beams and the first and second detector beams are arranged so that an absolute value of a de-coupling ratio D.R. is greater than or equal to 0.07, where $$D.R.=(fanti-fin)/fanti,$$

fin is a resonance frequency of the first detector weight and the second detector weight in an in-phase mode in which the first detector weight and the second detector weight oscillate in a same direction along the z-axis direction when an impact in the z-axis direction is applied, fanti is a resonance frequency of the first detector weight and the second detector weight in an anti-phase mode in which the first detector weight and the second detector weight oscillate in the opposite directions along the z-axis direction when the impact in the z-axis direction is applied, wherein each of the first detector beam and the second detector beam includes a second middle rigid body and two second torsion bars located in both ends of the second middle rigid body, and each of the first detector beam and the second detector beam is movable in the z-axis direction by torsion of the two second torsion bars.

9. The angular velocity sensor according to claim 8, wherein each of the two second torsion bars of the first detector beam and the second detector beam includes a second rectangular frame shape part, the second rectangular frame shape part includes third and fourth linear beams, one end and the other end of the third linear beam are coupled with one end and the other end of the fourth linear beam, respectively.

10. The angular velocity sensor according to claim 8, wherein the absolute value of the de-coupling ratio is greater than or equal to 0.2.

11. The angular velocity sensor according to claim 8, wherein the absolute value of the de-coupling ratio is greater than or equal to 0.4.

12. An angular velocity sensor for detecting an angular velocity, comprising:

a substrate having a stationary portion, wherein one direction on a plane surface of the substrate is defined as an x-axis direction, another direction on the plane surface of the substrate perpendicular to the x-axis direction is defined as a y-axis direction, and another direction perpendicular to the x-axis direction and the y-axis direction is defined as a z-axis direction;

two pair of driver weights including a first pair of driver weights (i) provided to the substrate, (ii) connected to the stationary portion of the substrate through a first supporting beam, and (iii) configured to oscillate in the y-axis direction when the angular velocity sensor detects the angular velocity, and a second pair of driver weights (i) provided to the substrate, (ii) connected to the stationary portion of the substrate through a second supporting beam, and (iii) configured to oscillate in the y-axis direction when the angular velocity is detected;

two detector weights including:

a first detector weight connected to the first pair of driver weights through a first detector beam and a second detector weight connected to the second pair of driver weights through a second detector beam;

a first detector electrode arranged at a first distance from the first detector weight; and a second detector electrode arranged at a second distance from the second detector weight, wherein:

a first capacitance is formed between the first detector weight and the first detector electrode and a second capacitance is formed between the second detector weight and the second detector electrode;

the angular velocity, application of which oscillates the first detector weight and the second detector weight in opposite directions along the z-axis direction and makes a first change in the first distance and a second change in the second distance, is detected by using a differential signal output indicating (i) a variation in the first capacitance caused by the first change in the first distance and (ii) a variation in the second capacitance caused by the second change in the second distance; and the first and second supporting beams and the first and second detector beams are arranged so that an absolute value of a de-coupling ratio D.R. is greater than or equal to 0.07, where D.R.=(fanti−fin)/fanti, fin is a resonance frequency of the first detector weight and the second detector weight in an in-phase mode in which the first detector weight and the second detector weight oscillate in a same direction along the z-axis direction when an impact in the z-axis direction is applied, fanti is a resonance frequency of the first detector weight and the second detector weight in an anti-phase mode in which the first detector weight and the second detector weight oscillate in the opposite directions along the z-axis direction when the impact in the z-axis direction is applied, wherein:

the substrate is a silicon-on-insulator (SOI) substrate having a structure in which a buried oxide film as a sacrifice layer is interposed between a supporting substrate and a semiconductor layer;

the first detector electrode is formed on a semiconductor layer side of the supporting substrate and arranged at a position corresponding to the first detector weight; and the second detector electrode is formed on the semiconductor layer side of the supporting substrate and arranged at a position corresponding to the second detector weight.

13. The angular velocity sensor according to claim 12, wherein the absolute value of the de-coupling ratio is greater than or equal to 0.2.

14. The angular velocity sensor according to claim 12, wherein the absolute value of the de-coupling ratio is greater than or equal to 0.4.

15. An angular velocity sensor for detecting an angular velocity, comprising:

a substrate having a stationary portion, wherein one direction on a plane surface of the substrate is defined as an x-axis direction, another direction on the plane surface of the substrate perpendicular to the x-axis direction is defined as a y-axis direction, and another direction perpendicular to the x-axis direction and the y-axis direction is defined as a z-axis direction;

two pair of driver weights including a first pair of driver weights (i) provided to the substrate, (ii) connected to the stationary portion of the substrate through a first supporting beam, and (iii) configured to oscillate in the y-axis direction when the angular velocity sensor detects the angular velocity, and a second pair of driver weights (i) provided to the substrate, (ii) connected to the stationary portion of the substrate through a second supporting beam, and (iii) configured to oscillate in the y-axis direction when the angular velocity is detected;

two detector weights including:
- a first detector weight connected to the first pair of driver weights through a first detector beam and
- a second detector weight connected to the second pair of driver weights through a second detector beam;

a first detector electrode arranged at a first distance from the first detector weight; and a second detector electrode arranged at a second distance from the second detector weight, wherein:

a first capacitance is formed between the first detector weight and the first detector electrode and a second capacitance is formed between the second detector weight and the second detector electrode;

the angular velocity, application of which oscillates the first detector weight and the second detector weight in opposite directions along the z-axis direction and makes a first change in the first distance and a second change in the second distance, is detected by using a differential signal output indicating (i) a variation in the first capacitance caused by the first change in the first distance and (ii) a variation in the second capacitance caused by the second change in the second distance; and the first and second supporting beams and the first and second detector beams are arranged so that an absolute value of a de-coupling ratio D.R. is greater than or equal to 0.07, where $$D.R.=(f_{anti}-f_{in})/f_{anti},$$

$f_{in}$ is a resonance frequency of the first detector weight and the second detector weight in an in-phase mode in which the first detector weight and the second detector weight oscillate in a same direction along the z-axis direction when an impact in the z-axis direction is applied, $f_{anti}$ is a resonance frequency of the first detector weight and the second detector weight in an anti-phase mode in which the first detector weight and the second detector weight oscillate in the opposite directions along the z-axis direction when the impact in the z-axis direction is applied, wherein:

the first detector electrode and the second detector electrode is integrated into a single detector electrode.

16. The angular velocity sensor according to claim 15, wherein the absolute value of the de-coupling ratio is greater than or equal to 0.2.

17. The angular velocity sensor according to claim 15, wherein the absolute value of the de-coupling ratio is greater than or equal to 0.4.

* * * * *